(12) United States Patent
Hughes et al.

(10) Patent No.: US 10,659,032 B2
(45) Date of Patent: May 19, 2020

(54) GAN-ON-SAPPHIRE MONOLITHICALLY INTEGRATED POWER CONVERTER

(71) Applicant: HRL Laboratories, LLC, Malibu, CA (US)

(72) Inventors: Brian Hughes, Woodland Hills, CA (US); Rongming Chu, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/180,434

(22) Filed: Nov. 5, 2018

(65) Prior Publication Data

US 2019/0165776 A1   May 30, 2019

Related U.S. Application Data

(62) Division of application No. 15/055,349, filed on Feb. 26, 2016, now Pat. No. 10,153,761.

(Continued)

(51) Int. Cl.
*H01L 21/66* (2006.01)
*H03K 17/041* (2006.01)
(Continued)

(52) U.S. Cl.
CPC ..... *H03K 17/04106* (2013.01); *H01L 23/642* (2013.01); *H01L 27/0605* (2013.01);
(Continued)

(58) Field of Classification Search
CPC .......... H03K 17/04106; H01L 29/7786; H01L 29/16; H01L 23/642; H01L 29/66462; H01L 29/2003
(Continued)

(56) References Cited

U.S. PATENT DOCUMENTS 6,246,592 B1   6/2001   Balogh
6,385,056 B1   5/2002   Gucyski
(Continued)

FOREIGN PATENT DOCUMENTS

CN   101263547 A   9/2008
CN   102142409 A   8/2011
(Continued)

OTHER PUBLICATIONS

International Search Report from PCT/US2016/019968 dated Jun. 30, 2016.
(Continued)

*Primary Examiner* — Vu A Vu
(74) *Attorney, Agent, or Firm* — Ladas & Parry

(57) ABSTRACT

A half bridge circuit includes a sapphire substrate, a GaN upper switch on the sapphire substrate, a GaN lower switch on the sapphire substrate and coupled to the GaN upper switch, a first conductor coupled to the upper switch, a second conductor coupled to the lower switch, and a capacitor. A portion of the first conductor and a portion of the second conductor are on a plane vertically separated from the upper switch and the lower switch by a height, and the capacitor is coupled between the portion of the first conductor and the portion of the second conductor.

20 Claims, 7 Drawing Sheets

Related U.S. Application Data

(60) Provisional application No. 62/239,616, filed on Oct. 9, 2015.

(51) Int. Cl.

| | | |
|---|---|---|
| *H01L 27/06* | (2006.01) | |
| *H01L 27/085* | (2006.01) | |
| *H01L 23/64* | (2006.01) | |
| *H01L 29/16* | (2006.01) | |
| *H01L 29/20* | (2006.01) | |
| *H01L 29/66* | (2006.01) | |
| *H01L 29/778* | (2006.01) | |
| *H02M 1/08* | (2006.01) | |
| *H02M 7/00* | (2006.01) | |
| *H01L 21/8252* | (2006.01) | |

(52) U.S. Cl.
CPC ............ *H01L 27/085* (2013.01); *H01L 29/16* (2013.01); *H01L 29/2003* (2013.01); *H01L 29/66462* (2013.01); *H01L 29/7786* (2013.01); *H01L 21/8252* (2013.01); *H01L 27/0629* (2013.01); *H02M 1/08* (2013.01); *H02M 7/003* (2013.01); *Y02B 70/1483* (2013.01)

(58) Field of Classification Search
USPC .......................................................... 438/14
See application file for complete search history.

(56) References Cited

U.S. PATENT DOCUMENTS

| | | | |
|---|---|---|---|
| 6,934,166 B2 | 8/2005 | Vinciarelli | |
| 6,954,368 B1 | 10/2005 | Francoeur et al. | |
| 6,984,965 B2 | 1/2006 | Vinciarelli | |
| 8,946,767 B2* | 2/2015 | Haeberlen | H01L 21/82347 |
| | | | 257/124 |
| 9,502,401 B2* | 11/2016 | Leomant | H01L 29/4175 |
| 10,153,761 B2 | 12/2018 | Hughes et al. | |
| 2004/0184289 A1 | 9/2004 | Vinciarelli | |
| 2005/0286271 A1 | 12/2005 | Vinciarelli | |
| 2006/0290689 A1 | 12/2006 | Grant et al. | |
| 2008/0073773 A1 | 3/2008 | Huber | |
| 2008/0136390 A1 | 6/2008 | Briere | |
| 2009/0085219 A1 | 4/2009 | Bayerer | |
| 2009/0140749 A1 | 6/2009 | Spah | |
| 2010/0246214 A1 | 9/2010 | Nakahori | |
| 2011/0043147 A1 | 2/2011 | Lin | |
| 2011/0180855 A1 | 7/2011 | Woody | |
| 2011/0316086 A1 | 12/2011 | Hauenstein | |
| 2012/0256193 A1 | 10/2012 | Hebert et al. | |
| 2014/0070627 A1* | 3/2014 | Briere | H01L 27/0605 |
| | | | 307/113 |
| 2014/0327479 A1 | 11/2014 | Giuliano | |
| 2014/0334203 A1 | 11/2014 | Honda et al. | |
| 2015/0014628 A1* | 1/2015 | Chung | H01L 27/0694 |
| | | | 257/13 |
| 2015/0035580 A1 | 2/2015 | Botti | |
| 2015/0116022 A1 | 4/2015 | Hughes et al. | |
| 2015/0130071 A1 | 5/2015 | Hohlfeld | |
| 2015/0155377 A1 | 6/2015 | Kim | |
| 2015/0162832 A1 | 6/2015 | Briere | |
| 2015/0221649 A1 | 8/2015 | Kub et al. | |
| 2016/0268185 A1 | 9/2016 | McKnight-MacNeil | |

FOREIGN PATENT DOCUMENTS

| | | |
|---|---|---|
| CN | 102738113 A | 10/2012 |
| DE | 10333315 A1 | 10/2005 |
| DE | 102010006850 A1 | 8/2011 |
| EP | 1376696 A1 | 1/2004 |
| JP | 2006319191 | 11/2006 |
| JP | 2010165789 A | 7/2010 |
| WO | 2013114565 A1 | 8/2013 |

OTHER PUBLICATIONS

Written Opinion of the International Searching Authority from PCT/US2016/019968 dated Jun. 30, 2016.
International Search Report from PCT/US2014/055020 dated Nov. 28, 2014.
Written Opinion of the International Searching Authority from PCT/US2014/055020 dated Nov. 28, 2014.
International Preliminary Report on Patentability from PCT/US2014/055020 dated Sep. 21, 2015.
International Preliminary Report on Patentability from PCT/US2016/019968 dated Oct. 19, 2017.
Non-Final Office Action from U.S. Appl. No. 14/065,715, dated Oct. 22, 2014.
Notice of Allowance from U.S. Appl. No. 14/065,715, dated Mar. 3, 2015.
General Considerations for IGBT and Intelligent Power Modules (Mitsubishi Semiconductors Power Modules MOS) Sep. 1998.
Notice of Allowance from U.S. Appl. No. 15/055,349, dated Aug. 7, 2018.
Non-Final Office Action from U.S. Appl. No. 15/055,349, dated Dec. 27, 2017.
Extended European Search Report from EP 16854011.0, dated Dec. 10, 2018.
First Office Action from CN app. No. 201480041805.9, dated Oct. 17, 2017, with English translation from Global Dossier.
Partial Supplementary European Search Report from EP app. No. 14859039.1, dated Oct. 9, 2017.
Extended European Search Report from EP app. No. 14859039.1, dated Jan. 12, 2018.
FSFR Series-Power Switch Datasheet (Fairchild Semiconductor) pp. 1-18; Jun. 2010.

* cited by examiner

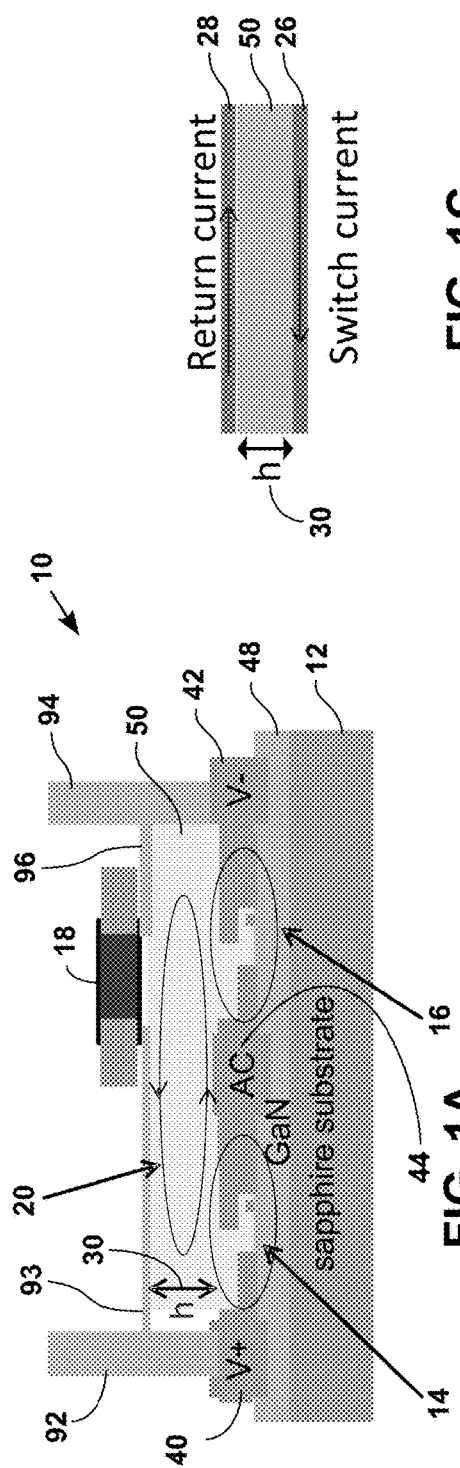
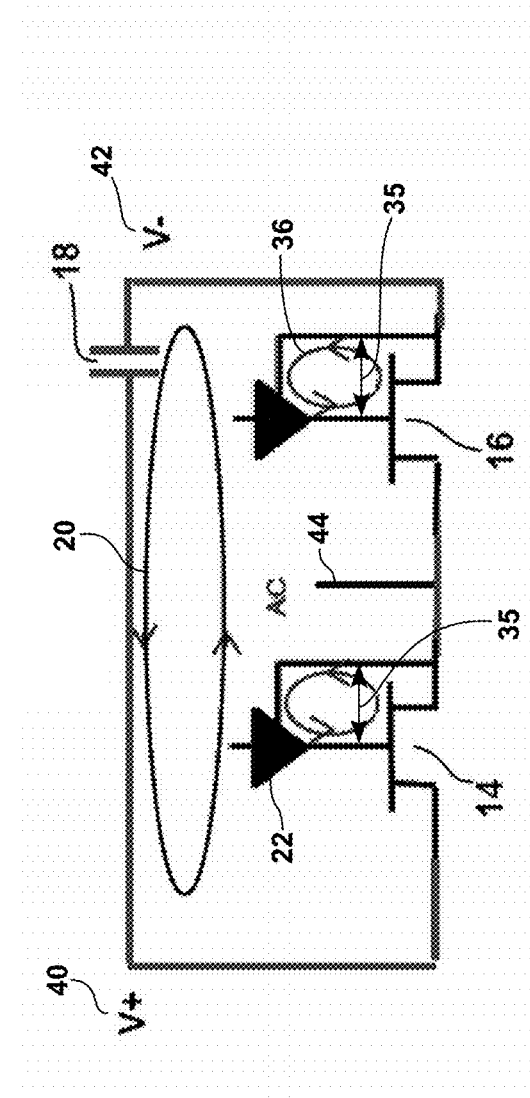
FIG. 1A
FIG. 1B
FIG. 1C

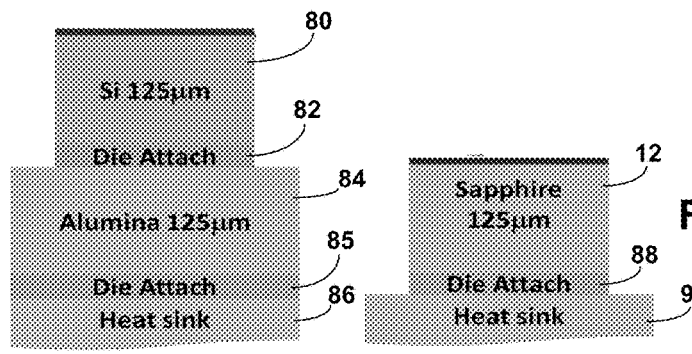
FIG. 2A
FIG. 2B
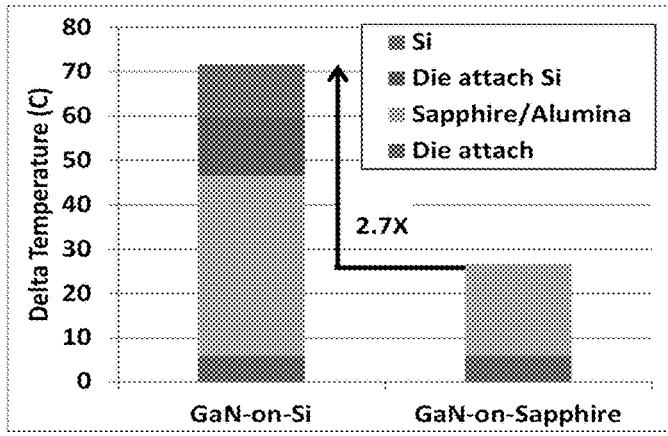
FIG. 2C

GAN-ON-SAPPHIRE MONOLITHICALLY INTEGRATED POWER CONVERTER

CROSS-REFERENCE TO RELATED APPLICATIONS

This application is the Divisional Application of the U.S. patent application Ser. No. 15/055,349, filed on Feb. 26, 2016, which is related to and claims the benefit of U.S. Provisional Patent Application Ser. No. 62/239,616, filed Oct. 9, 2015, and is related to U.S. patent application Ser. No. 14/065,715, filed Oct. 29, 2013, which are incorporated herein as though set forth in full.

STATEMENT REGARDING FEDERAL FUNDING

None

TECHNICAL FIELD

This disclosure relates to power converters.

BACKGROUND

Discrete 600V GaN-on-Si power switches are in the prior art. For example, the companies International Rectifier and Transphorm have cascode GaN switches which heterogeneously combine a low voltage Si MOSFET and a normally-on GaN switch in a package. However, the cascode technology used is not suitable for a GaN IC half bridge circuit.

The low switching loss of 600V GaN HEMTs (high electron mobility transistors) has enabled increasing the switching frequency to decrease the size and weight of power converters. However, GaN power converters in the prior art have been limited to a switching frequency of about 1 MHz due to inductor loss, because ferrites in inductors become lossy above about 1 MHz.

The University of Colorado (UC) has reported GaN converters at a switching frequency of 200 MHz. These GaN converters use air-core inductors, which are small and efficient at this high frequency; however, the switching voltages are limited to only about 25V. The UC GaN converters are built on an insulating substrate, so the converters have a low parasitic output capacitance, which is needed for an efficient zero voltage switching (ZVS) converter at high frequency. However, the insulating substrate used in these converters used is SiC, and 6-inch SiC substrates are very expensive.

Silicon (Si) has been the preferred substrate for GaN power electronics. However, there are problems of dynamic on-resistance, leakage current, parasitic output capacitance, and reliability for GaN-on-Si, and as discussed above the switching frequency of high power converters is limited to about 1 MHz by ferrite core inductor losses. Most of the power electronic industry operates at 10 to 100 kHz, and most of the power converters have inductances of the order of 10 nH.

What is needed is an improved power converter that can operate at high switching frequencies and high voltage. The embodiments of the present disclosure answer these and other needs.

SUMMARY

In a first embodiment disclosed herein, a half bridge circuit comprises a sapphire substrate, a GaN upper switch on the sapphire substrate, a GaN lower switch on the sapphire substrate and coupled to the GaN upper switch, a first conductor coupled to the upper switch, a second conductor coupled to the lower switch, and a capacitor, wherein a portion of the first conductor and a portion of the second conductor are on a plane vertically separated from the upper switch and the lower switch by a height, and wherein the capacitor is coupled between the portion of the first conductor and the portion of the second conductor.

In another embodiment disclosed herein, a method for fabricating a half bridge circuit comprises growing GaN epitaxy on a sapphire wafer, fabricating an upper switch and a lower switch in the GaN epitaxy, forming a first gate driver in the GaN epitaxy, forming a second gate driver in the GaN epitaxy, forming a first metal post, forming a second metal post, forming a first conductor coupled to the upper switch, wherein a portion of the first conductor is supported by the first and second metal posts on a plane vertically separated from the upper switch and the lower switch by a height, forming a second conductor coupled to the lower switch, wherein a portion of the second conductor is supported by the first and second metal posts on a plane vertically separated from the upper switch and the lower switch by a height, providing a capacitor coupled between the portion of the first conductor and the portion of the second conductor, and forming interconnects between the first gate driver, the upper switch, the second gate driver, the lower switch, the first metal post, the second metal post, the first conductor, and the second conductor to form one or more half bridge integrated circuits.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1A shows a cross section of a half bridge power loop circuit and FIG. 1B shows a circuit diagram for the half bridge circuit of FIG. 1A in accordance with the present disclosure;

FIG. 1C shows a cross section view of the vertical power loop showing the switch current and the return current path separated by a height h in accordance with the present disclosure;

FIG. 2A shows a cross-section of GaN-on-Si showing a thermal path to a heat sink in accordance with the prior art;

FIG. 2B shows a cross-section of GaN-on-sapphire showing a thermal path to a heat sink in accordance with the present disclosure;

FIG. 2C shows the temperature rise across each layer for a power switch fabricated with GaN-on-Si in accordance with the prior art compared the temperature rise for a power switch fabricated with GaN-on-sapphire in accordance with the present disclosure;

DETAILED DESCRIPTION

Figure 1D:
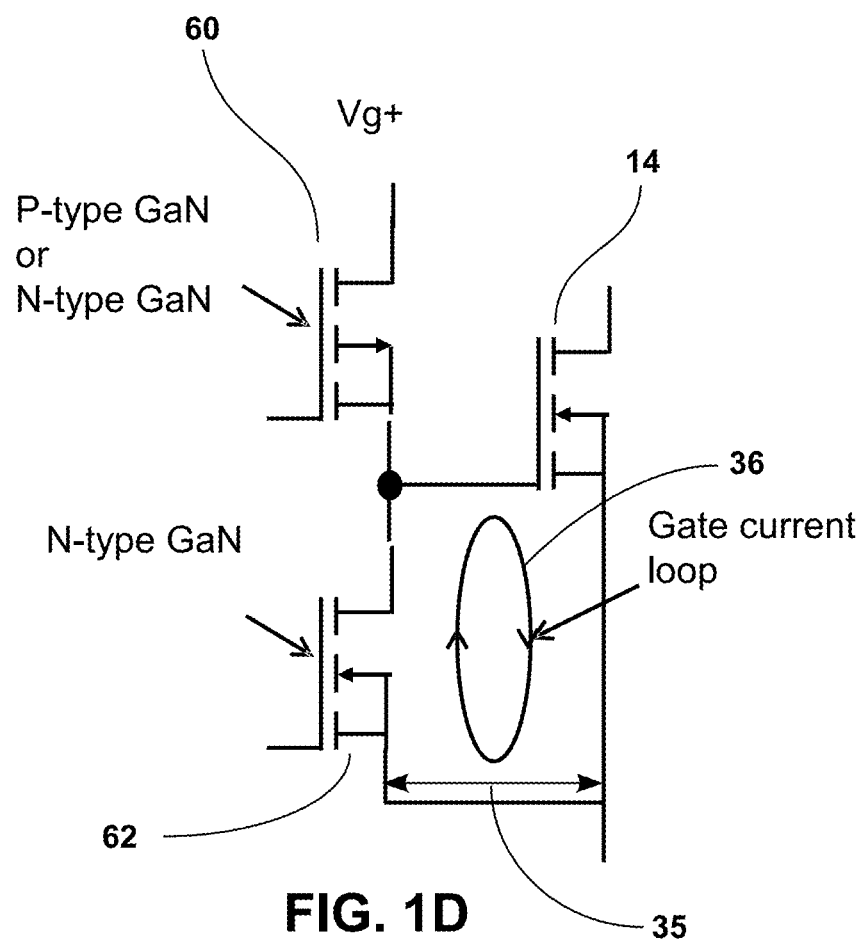
FIG. 1D shows a circuit diagram for a gate driver circuit in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In the present disclosure, a power converter 10, as shown in FIG. 1A, is described. The power converter 10 may be a direct current (DC) to DC or an alternating current (AC) to DC power converter. The power converter 10 has a GaN upper switch 14 and a GaN lower switch 16 to form a GaN half bridge circuit, as shown in FIG. 1B. Half bridge circuits are well known in the art. The upper switch 14 and the lower switch 16 are implemented in a GaN epitaxy 48, which is formed on a sapphire substrate 12 according to methods well known in the art. The descriptions "upper" and "lower" do not refer to a physical arrangement, but rather to the switches potential relative to ground. The electric potential V+ 40 and V− 42 are connected to the upper switch 14 and the lower switch 16, respectively, as shown in FIG. 1B. AC voltage 44 is connected between the switches 14 and 16 as shown in FIG. 1B. The upper 14 and lower 16 switches may be normally-off n-channel GaN field effect transistor switches.

Monolithic integration of the GaN half bridge circuit 10 on the sapphire substrate 12 reduces parasitic inductance by eliminating bond wires and reducing the space between the critical components of the power converter.

Further, by including a vertical power loop 20 over the top of the power switches 14 and 16, which includes at least part of the bus capacitance 18, as shown in FIG. 1A, the inductance of the power switch may be greatly decreased. This is further illustrated in FIG. 1C which shows the switch current 26 and the return current 28 traveling in opposite directions and separated by a height 30. The close spacing and the opposite directions of the switch and return currents operate to reduce inductance. The volume or cavity 50 between the switch current 26 and the return current 28 may be filled with a gas, such as air, or be filled with polyimide or benzocyclobutene (BCB).

The height h 30 between the opposing currents in the vertical power loop 20 may range from 1 µm to 100 µm. This small height h 30 results in a greatly reduced vertical power loop 10 inductance, which may range from less than 50 pH to 200 pH. In one embodiment the height h 30 may be 5 µm. The estimated power loop inductance for a 200 W 400V half bridge with a height h 30 of 5 µm is less than 50 pH, as shown by point 32 in the graph of FIG. 4. This ultra-low inductance of less than 50 pH enables switching frequencies ranging from 1 MHz to 100 MHz. The switching voltages may range from 10 volts to 1000 volts. The low inductance also limits voltage overshoot to about 20 volts. Limiting the voltage overshoot during switching is important, because a large overshoot can damage a power switch.

Figure 4:
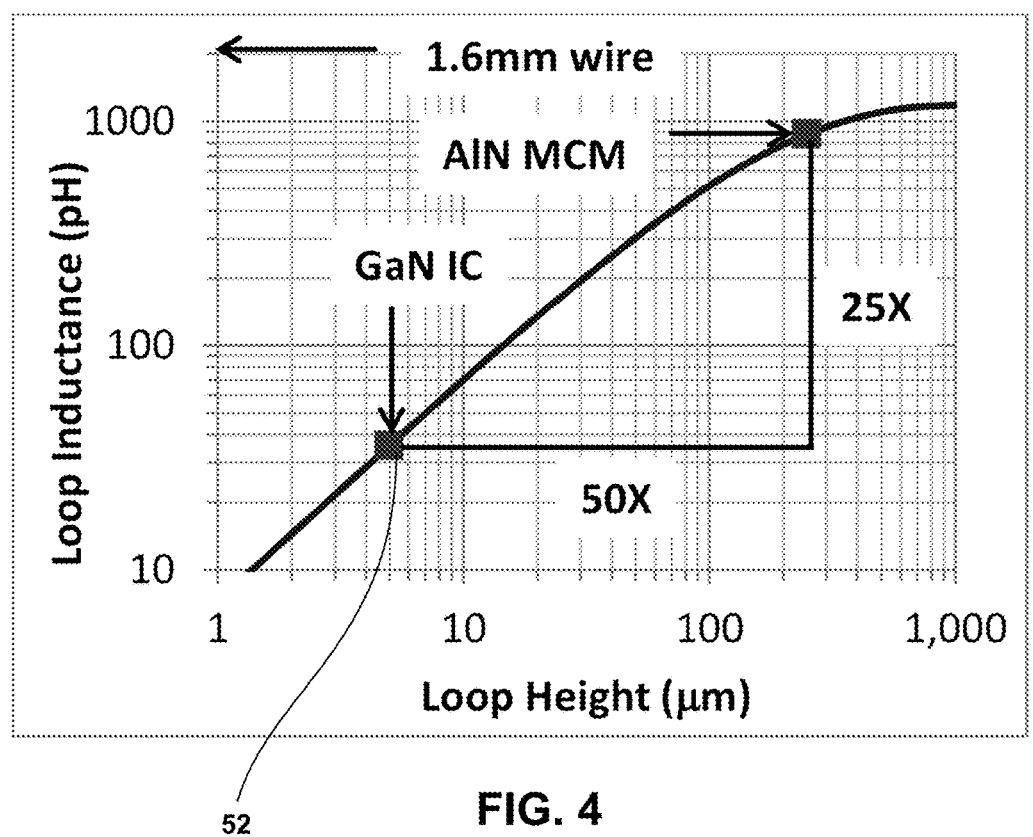
FIG. 4 shows a graph of vertical power loop inductance vs. loop height h in accordance with the present disclosure.

FIG. 4 shows a graph of vertical loop inductance versus vertical loop height h 30. The GaN half bridge on sapphire is shown to have 25 times less loop inductance and a loop height h 30 that is 50 times less than is achieved in a prior art AlN multichip module (MCM).

The equation below expresses the vertical loop inductance per vertical loop length:

$$\frac{L_{loop}}{Len} \approx \frac{W_{loop}}{h}\left(0.125 * \ln\left[1 + \frac{11.3}{W_{loop/h}}\right]\right)^2 \approx \frac{1.7}{W_{loop}/h} nH/mm$$

where $L_{loop}$ is vertical power loop inductance;
where $L_{en}$ is the length of the vertical power loop;
where $W_{loop}$ is the width of the vertical power loop, and
where h is the height of the vertical power loop.

Figure 1E:
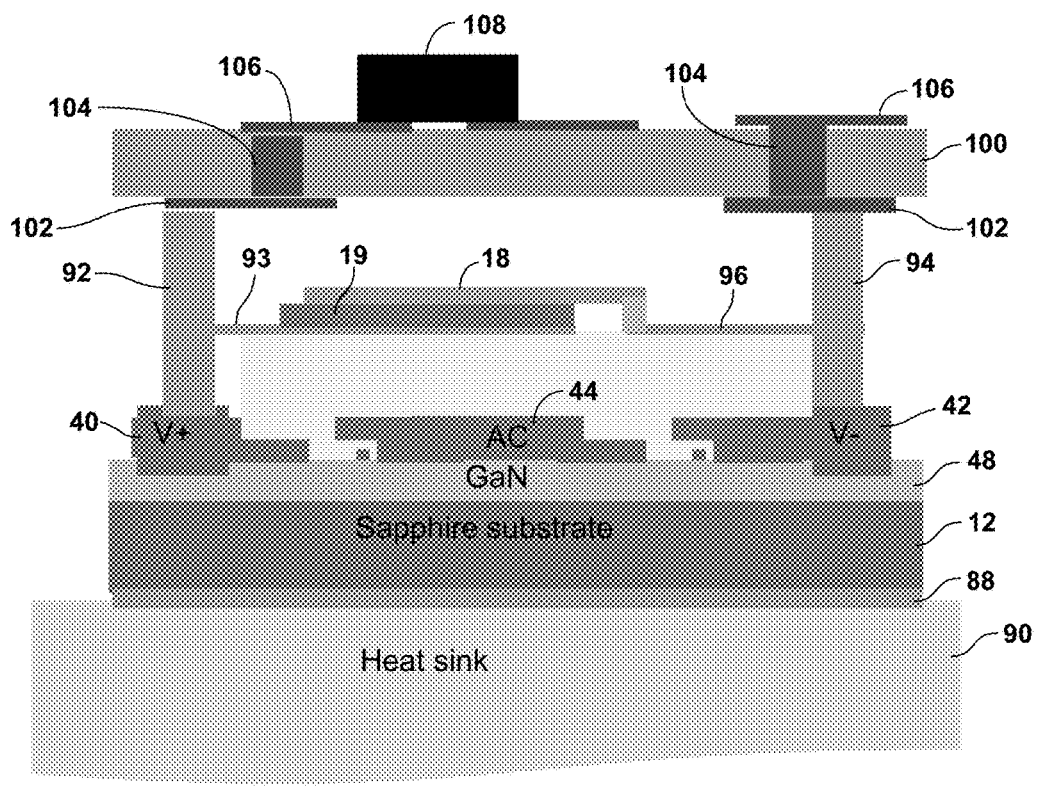
FIG. 1E shows another cross section of a half bridge power loop circuit in accordance with the present disclosure.

The power loop bus capacitor 18 may be integrated above the upper 14 and lower switches 16, as shown in FIGS. 1A and 1E. The power loop bus capacitor 18 may be a discrete capacitor, as shown in FIG. 1A, or may be a monolithically integrated metal-insulator-metal capacitor, as shown in FIG. 1E. Bump contact 92 may be coupled to the upper switch 14, and bump contact 94 may be coupled to the lower switch 16 to support the upper part of the vertical power loop and provide contacts to the capacitor 18 by conductors 93 and 96, respectively, which are sturdy enough to support the capacitor 18 above the sapphire substrate 12 and maintain the height h 30. The conductors 93 and 96 may be on a power loop substrate supported on the bump contacts 92 and 94. The conductors 93 and 96 are vertically spaced from the upper switch 14 and the lower switch by the height h 30.

Other methods may also be used to support the upper part of the vertical power loop. For example, the bump contacts 92 and 94 may be metal posts, or nonmetallic posts with through vias, or posts with conductors on the posts to provide the electrical interconnect for the power loop. As shown in FIGS. 1A and 1E the bump contacts 92 and 94 are on opposite ends of the vertical power loop 20. Bump contact 92 is on one end of conductor 93, and bump contact 94 is on one end of conductor 96.

As shown in FIG. 1E, the capacitor 18 may be monolithically integrated with the conductors 93 and 96, by placing a dielectric 19 between a portion of the conductors 93 and 96. Also, a printed circuit board 100, which may have additional components, such as component 108, may be connected to bump contacts 92 and 94. Electrical contact to the top of the printed circuit board and to the component 108 may be provided by contacts or conductors 102, through vias 104 and conductors 106.

Gate drivers 22 and 24, as shown in FIG. 1B, for the upper switch 14 and the lower switch 16, respectively, may also be integrated together with the power switches 14 and 16 on the sapphire substrate 12. FIG. 1D shows an example gate driver 22 for upper switch 14. The gate driver may have one n-channel transistor 60, which may be a GaN field effect transistor (FET), connected to Vg and to the gate of upper switch 14 and another n-channel transistor 62, which may be a FET, connected to the transistor 60 and connected between the source of the upper switch 14 and the gate of upper switch 14. The gate loop current 36 is through the transistor 62 and from the gate to the source of upper switch 14. In another embodiment, the n-channel transistor 60 may instead be a p-channel transistor 60. The gate driver 24 for the lower switch 16 may be similar to gate driver 22. The voltage rating of gate driver switches 60 and 62 may be 5 times lower than the voltage rating for the upper 14 and lower 16 switches.

To reduce the gate loop inductance it is desirable to reduce the height 35, as shown in FIG. 1D of the gate current loop 36. The height 35 for the gate current loop 36, as shown in FIGS. 1B and 1C, may be less than or equal to 0.5 µm, which operates to significantly reduce the gate inductance and thereby reduce rise and fall times. The rise and fall times for switching the upper switch 14 or the lower switch 16 from one state to another state may be less than 0.2 ns. The height 35 of less than or equal to 0.5 µm still is able to support a gate drive of up to 20 volts.

Compared to the prior art converters that have discrete GaN switches and gate drivers, the power converter of the present disclosure has less switching loss, less dynamic on-resistance, less thermal resistance, and 10 to 100 times faster switching frequencies. These advantages enable a 10 times reduction in size and weight, and a 2 times reduction in cost.

GaN on sapphire greatly reduces or eliminates the parasitic output capacitance from the upper 14 and lower 16 switches to the sapphire substrate 12. The output capacitance per gate width may be only 0.1 pF/mm, which is approximately 6 times lower than the parasitic output capacitance for GaN-on-Si. The low parasitic output capacitance also reduces the needed switching energy and switching charge, which results in a lower switching loss for both hard and soft switched power converters. A significant reduction of output charge is critical to increasing efficient soft switching to more than a 30 MHz switching frequency.

For zero-voltage-switching (ZVS) the time for charging and discharging the parasitic capacitance must be small compared to the switching period because a converter is not processing power during this period. The charging time is the output charge, $Q_{oss}$, divided by the switching current. A small $Q_{oss}$ and parasitic output capacitance, $C_{ossp}$, are required for a short charging time. The described GaN integrated circuit (IC) half bridge circuit on a sapphire substrate 12 is estimated to reduce $C_{ossp}$ by 6 times compared to GaN-on-Si. The lower $C_{ossp}$ enables greater than 90% efficiency for ZVS switching at a 10 to 100 times higher frequency than a GaN-on-Si half bridge circuit. The parasitic capacitance of the GaN-on-Si is charged and discharged through the Si substrate resistance, which reduces the efficiency of a ZVS converter. The GaN integrated circuit (IC) half bridge circuit on a sapphire substrate 12 eliminates this parasitic capacitance and its associated loss.

Prior art monolithically integrated GaN-on-Si half bridge circuits have a disadvantage of having a high dynamic on-resistance because the high voltage on the AC node can affect the substrate bias. The insulating sapphire substrate 12 reduces the degradation of the dynamic on-resistance of the low-side switch 16.

The upper 14 and lower 16 switches may be normally-off n-channel GaN field effect transistor switches, and may be lateral GaN HEMT structures formed in the GaN epitaxy 48. GaN HEMT structures together with the monolithic integration enable 600V GaN power switches with low dynamic on-resistance and upper 14 and lower 16 switches requiring less than a 20V GaN gate drive.

Figure 1F:
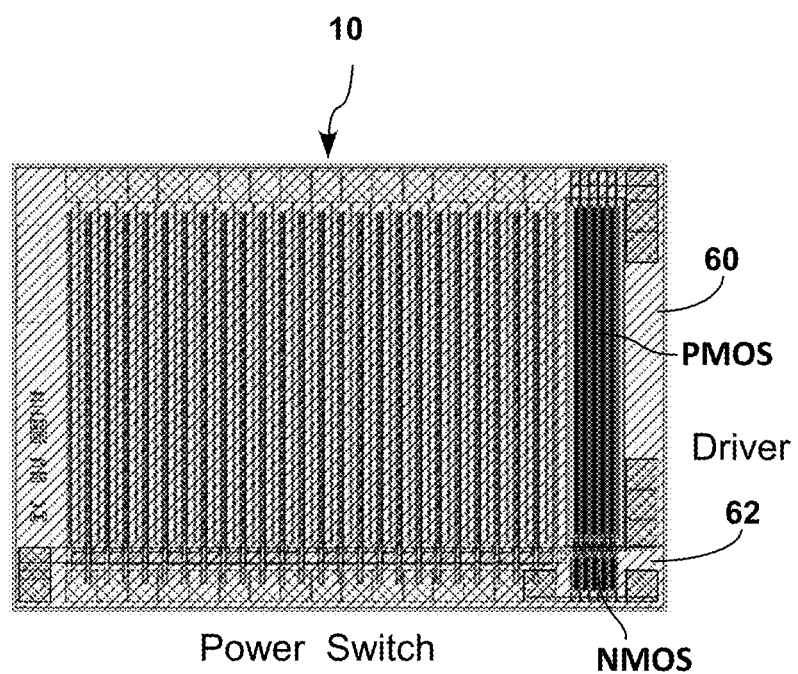
FIG. 1F shows a photograph of a fabricated half bridge circuit including gate drivers in accordance with the present disclosure.

FIG. 1F shows a photograph of a fabricated power switch with a half bridge circuit integrated with PMOS and NMOS gate drivers.

As shown in FIG. 2A, GaN-on-Si switches 80 are normally die attached 82 to an insulating alumina ($Al_2O_3$) substrate 84, which is subsequently attached 85 to a heat sink 86. In the present disclosure, as shown in FIG. 2B, the GaN-on-sapphire switches are on a sapphire substrate 12, which is die attached 88 directly to a heat sink 90. Single crystal sapphire has twice the thermal conductivity of alumina. GaN on sapphire eliminates the thermal resistance of the Si substrate and the thermal resistance through the alumina to the heat sink associated with GaN-on-Si switches. The estimated thermal resistance is reduced by 2.7 times, as shown in FIG. 2C, which allows the GaN IC half bridge on sapphire to operate 2.7 times less efficiently for the same junction temperature with the same heat sink as a GaN IC half bridge on Si. Alternatively, the GaN IC half bridge on sapphire can be operated at a higher frequency at which the losses are 2.7 times higher. Operating at a higher frequency enables converters to be made that are smaller, lighter, and less expensive.

Figure 3:
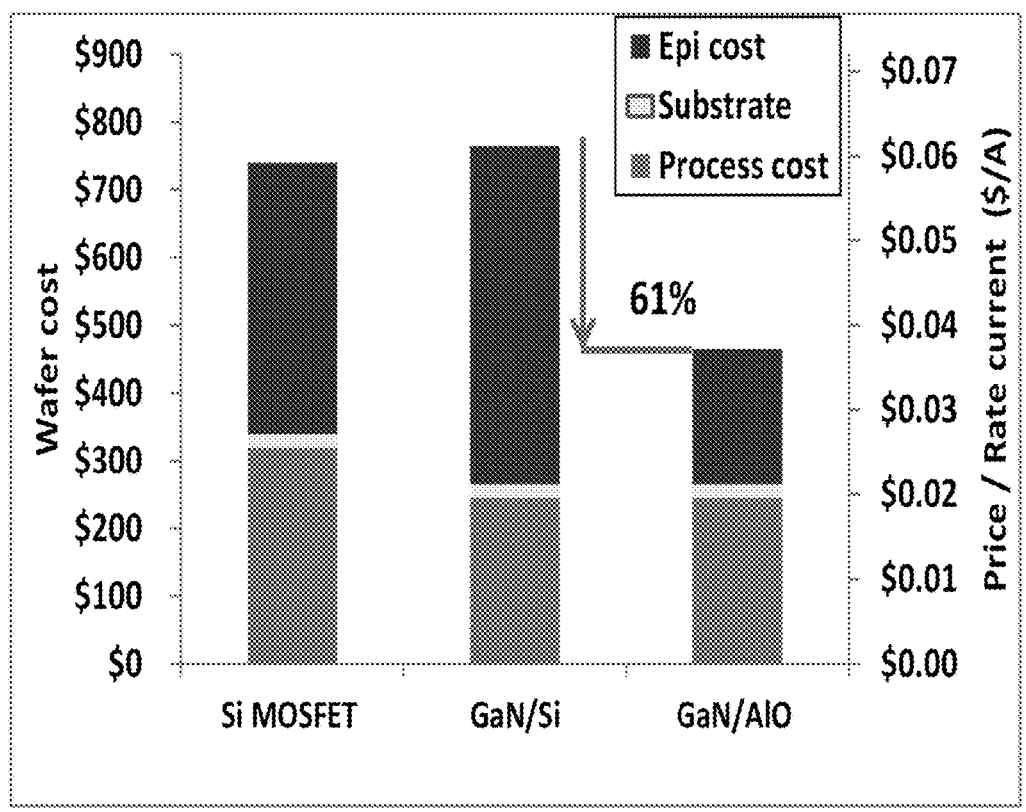
FIG. 3 shows a comparison of the estimated costs for the epi, the substrate, and the processing for Si SJMOSFET, GaN-on-Si, and GaN-on-sapphire, and shows that GaN-on-sapphire has the lowest cost in accordance with the present disclosure.

It is estimated that the cost of GaN-on-Sapphire power switches is about 61% of the cost of GaN-on-Si switches, as shown in FIG. 3. The cost of the power switches includes the substrate cost which similar for 6-inch Si and sapphire, the epitaxial growth cost, which is less than half of the cost for a sapphire substrate as compared to a Si substrate, and the processing cost, which is estimated to be the same.

GaN power switches in the prior art have used GaN-on-Si because 6-inch low-cost substrates were inexpensive. However, the cost of 6-inch sapphire substrates are now similar in cost to Si substrates. The largest component of the cost of a GaN-on-Si finished wafer is the GaN epitaxy. GaN-on-Si requires about 5 µm of GaN to support the 600V rated voltage. GaN epitaxy costs about $100/µm which is $500 for a 6-inch substrate. Sapphire is an insulating substrate, so the GaN epitaxy can be reduced to less than 2 µm or $200 for a 6-inch substrate. Also GaN on sapphire eliminates assembly and package costs because the GaN IC on sapphire may be mounted directly on a heat sink and assembled on a printed circuit board using flip chip connections to the bump contacts 92 and 94.

Also, integration of the half bridge circuit with the gate drivers 22 and 24 eliminates assembly and package cost.

The following is a process for fabricating a GaN IC on sapphire half bridge circuit. First, about 2 µm of GaN epitaxy 48 is grown on a 6-inch sapphire substrate 12 using a GaN metal-organic chemical vapor deposition (MOCVD) reactor. Then GaN HEMTs may be fabricated in the GaN epitaxy 48 using isolation, ohmic, gate, and gate field plate process steps that are well known in the prior art. Next, multi-layer metallization may be used to integrate the upper 14 and lower 16 switches, form the vertical 20 power loops, and form contacts to form a half bridge circuit integrated circuits (ICs). Then the ICs on the wafer may be on-wafer tested and back-side processed. Next, the ICs for each half bridge circuit may be separated by dicing the wafer. Then, the sapphire substrate 12 of a IC die is directly attached 88 to a heat sink 90. Finally, the GaN IC die is attached to a printed circuit board 100 using bump contacts 92 and 94.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for fabricating a half bridge circuit comprising:
   growing GaN epitaxy on a sapphire wafer;
   fabricating an upper switch and a lower switch in the GaN epitaxy;
   forming a first gate driver in the GaN epitaxy;
   forming a second gate driver in the GaN epitaxy;
   forming a first metal post;
   forming a second metal post;
   forming a first conductor coupled to the upper switch, wherein a portion of the first conductor is supported by the first and second metal posts on a plane vertically separated from the upper switch and the lower switch by a height;
   forming a second conductor coupled to the lower switch, wherein a portion of the second conductor is supported by the first and second metal posts on a plane vertically separated from the upper switch and the lower switch by the height;
   providing a capacitor coupled between the portion of the first conductor and the portion of the second conductor; and
   forming interconnects between the first gate driver, the upper switch, the second gate driver, the lower switch, the first metal post, the second metal post, the first conductor, and the second conductor to form one or more half bridge integrated circuits.

2. The method of claim 1 further comprising:
   testing the half bridge integrated circuits on the wafer.

3. The method of claim 1 further comprising: dicing the sapphire wafer into half bridge die each having a sapphire substrate; and directly attaching the sapphire substrate to a heat sink.

4. The method of claim 3 further comprising:
   attaching a printed circuit board to the first metal post and the second metal post.

5. The method of claim 1 wherein:
   the GaN epitaxy is about 2 μm thick.

6. The method of claim 1 wherein:
   a switched current passes through the upper switch and the lower switch; and a return current passes through the portion of the first conductor and the portion of the second conductor;
   wherein a power loop inductance in a path for the switched current and the return current depends on the height; and
   wherein the height ranges from 1 μm to 100 μm.

7. The method of claim 6 wherein the power loop inductance ranges from less than 50 pH to 200 pH.

8. The method of claim 1 wherein a switching voltage ranges from 10 volts to 1000 volts.

9. A method of providing a half bridge circuit comprising:
   providing a sapphire substrate;
   providing a GaN upper switch on the sapphire substrate;
   providing a GaN lower switch on the sapphire substrate and coupled to the GaN upper switch;
   providing a first conductor coupled to the upper switch;
   providing a second conductor coupled to the lower switch;
   providing a portion of the first conductor and a portion of the second conductor on a plane vertically separated by a height from the upper switch and the lower switch;
   providing a first post coupled between the upper switch and the portion of the first conductor for supporting the portion of the first conductor and the portion of the second conductor on the plane vertically separated by the height from the upper switch and the lower switch;
   providing a second post coupled between the lower switch and the portion of the second conductor for supporting the portion of the first conductor and the portion of the second conductor on the plane vertically separated by the height from the upper switch and the lower switch; and
   providing a capacitor coupled between the portion of the first conductor and the portion of the second conductor.

10. The method of claim 9 further comprising:
    passing a switched current passes through the upper switch and the lower switch; and
    passing a return current passes through the portion of the first conductor and the portion of the second conductor;
    wherein a power loop inductance in a path for the switched current and the return current depends on the height.

11. The method of claim 9 wherein the height ranges from 1 μm to 100 μm.

12. The method of claim 10 wherein the power loop inductance ranges from less than 50 pH to 200 pH.

13. The method of claim 9 wherein a switching voltage ranges from 10 volts to 1000 volts.

14. The method of claim 9 wherein the upper switch and the lower switch comprise normally-off n-channel GaN transistors.

15. The method of claim 9 wherein a space between the plane and the upper and lower switches comprises gas, air, polyimide or benzocyclobutene (BCB).

16. The method of claim 9:
    wherein the first post is a first bump contact, a first metallic post, or a first nonmetallic post comprising a second portion of the first conductor; and
    wherein the second post is a second bump contact, a second metallic post, or a second nonmetallic post comprising a second portion of the second conductor.

17. The method of claim 9 further comprising:
    providing a first gate driver; and
    providing a second gate driver;
    wherein the upper switch comprises a first field effect transistor having a source, a drain, and a gate coupled to the first gate driver;

wherein the lower switch comprises a second field effect transistor having a source, a drain, and a gate coupled to the second gate driver;

wherein the source of the upper switch is connected to the drain of the lower switch;

wherein the source of the upper switch is coupled to the first gate driver;

wherein the source of the lower switch is coupled to the second gate driver;

wherein an alternating circuit source is connected to the source of the upper switch and the drain of the lower switch;

wherein a positive voltage source is connected to the capacitor and the drain of the upper switch; and wherein a negative voltage source is connected to the capacitor and the source of the lower switch.

18. The method of claim 17:
wherein the first and second gate driver are monolithically integrated on the sapphire substrate;
wherein the first gate driver comprises two n-channel GaN transistors, or a p-channel GaN transistor and an n-channel GaN transistor; and
wherein the second gate driver comprises two n-channel GaN transistors, or a p-channel GaN transistor and an n-channel GaN transistor.

19. The method of claim 17 wherein:
a drive voltage from the first gate drive is equal to or less than 20 volts; and
a drive voltage from the second gate drive is equal to or less than 20 volts.

20. The method of claim 17 wherein:
a voltage rating of the first and second gate driver is greater than 5 times lower than a voltage rating of the upper and lower switches.

* * * * *